(12) United States Patent
Nakanishi (10) Patent No.: US 11,962,170 B2
(45) Date of Patent: Apr. 16, 2024

(54) POWER TRANSMISSION DEVICE (71) Applicant: Mitsubishi Electric Corporation, Tokyo (JP)

(72) Inventor: Takuya Nakanishi, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 7 days.

(21) Appl. No.: 17/923,235

(22) PCT Filed: Jun. 1, 2020

(86) PCT No.: PCT/JP2020/021533
§ 371 (c)(1),
(2) Date: Nov. 4, 2022

(87) PCT Pub. No.: WO2021/245723
PCT Pub. Date: Dec. 9, 2021

(65) Prior Publication Data
US 2023/0074976 A1 Mar. 9, 2023

(51) Int. Cl.
H02J 50/10 (2016.01)
G01R 19/10 (2006.01)
G01R 19/165 (2006.01)
H02J 50/40 (2016.01)
(Continued)

(52) U.S. Cl.
CPC .............. H02J 50/90 (2016.02); G01R 19/10 (2013.01); G01R 19/16571 (2013.01); H02J 50/10 (2016.02); H02J 50/402 (2020.01); H02M 7/5387 (2013.01)

(58) Field of Classification Search
None
See application file for complete search history.

(56) References Cited

U.S. PATENT DOCUMENTS

2013/0038281 A1  2/2013  Sakakibara et al.
2015/0155737 A1* 6/2015  Mayo ................... H04B 5/0081
                                                        320/108
2015/0311725 A1 10/2015  Yamamoto et al.
(Continued)

FOREIGN PATENT DOCUMENTS

JP  2011-234496 A  11/2011
JP  2015-216828 A  12/2015
(Continued)

OTHER PUBLICATIONS

International Search Report and Written Opinion dated Aug. 18, 2020, received for PCT Application PCT/JP2020/021533, Filed on Jun. 1, 2020, 8 pages including English Translation.

Primary Examiner — Jared Fureman
Assistant Examiner — Joel Barnett
(74) Attorney, Agent, or Firm — XSENSUS LLP (57) ABSTRACT An inverter and power transmission coils are connected such that currents flow in opposite directions to each other when selection switches of respective power transmission coils adjacent to each other, out of a plurality of power transmission coils disposed in the movement direction of a mobile body, are caused to be conductive. The difference in currents flowing in the opposite directions is measured, and compared with a threshold, whereby whether or not a power reception coil mounted to the mobile body is present above the power transmission coil can be determined.

6 Claims, 10 Drawing Sheets (51) Int. Cl.
*H02J 50/90* (2016.01)
*H02M 7/5387* (2007.01)

(56) References Cited

U.S. PATENT DOCUMENTS

| | | |
|---|---|---|
| 2017/0325182 A1 | 11/2017 | Akuzawa et al. |
| 2017/0363763 A1 | 12/2017 | Yamamoto et al. |
| 2018/0141443 A1* | 5/2018 | Lee .................... H02J 7/0042 |
| 2021/0082617 A1* | 3/2021 | Varghese ............. H02J 50/005 |
| 2021/0281118 A1* | 9/2021 | Smith ................ H02J 7/00034 |

FOREIGN PATENT DOCUMENTS

| | | |
|---|---|---|
| JP | 2016-39644 A | 3/2016 |
| JP | 6221460 B2 | 11/2017 |
| WO | 2016/088261 A1 | 6/2016 |

\* cited by examiner

FIG. 16 ers, detection devices such as a
camera and an infrared sensor need to be separately provided. This causes increase in the number of peripheral
components, resulting in increase in cost. Further, in the case
of an infrared sensor, it is difficult to discern whether an
object having passed above the infrared sensor is a power
reception coil to be fed with power, or another object.

POWER TRANSMISSION DEVICE

CROSS-REFERENCE TO RELATED APPLICATION

The present application is based on PCT filing PCT/JP2020/021533, filed Jun. 1, 2020, the entire contents of which are incorporated herein by reference.

TECHNICAL FIELD

The present disclosure relates to a power transmission device.

BACKGROUND ART

There are non-contact power feeding technologies in which power is transmitted by magnetic field coupling between two coils separated from each other. In order to apply such a non-contact power feeding technology to a power supply to a mobile body such as an automobile, an elevator, or a transportation device a factory, various technologies are being developed. Among them, there are a technology of appropriately switching a plurality of coils installed in the advancing direction of a mobile body, and a technology relating to a coil installation method (see Patent Document 1, for example). In order to realize non-contact power feeding to a mobile body, a plurality of power transmission coils are installed on a movement path, and power transmission coils for transmitting power to a power reception coil mounted to the mobile body are sequentially switched in accordance with movement of the mobile body. In this case, it is necessary to detect, among the plurality of installed power transmission coils, on which power transmission coil the mobile body is present, or on which power transmission coil the mobile body is not present.

CITATION LIST

Patent Document

Patent Document 1: Japanese Patent No. 6221460

SUMMARY OF THE INVENTION

Problems to be Solved by the Invention

As such detection means, as described in Patent Document 1, there is a method in which the position of the power reception coil is detected by a camera to determine whether the position of the power reception coil is in an effective range of a power transmission coil, or the position of the coil of the mobile body is directly detected by using an infrared sensor.

However, in both of discernment by a camera and discernment by an infrared sensor, detection devices such as a camera and an infrared sensor need to be separately provided. This causes increase in the number of peripheral components, resulting in increase in cost. Further, in the case of an infrared sensor, it is difficult to discern whether an object having passed above the infrared sensor is a power reception coil to be fed with power, or another object.

The present disclosure has been made in order to solve the problem as described above. An object of the present disclosure is to provide a power transmission device that can detect the position of a power reception coil without needing an additional sensor.

Solution to the Problems

A power transmission device disclosed in the present disclosure is a power transmission device including:
an inverter for outputting AC power;
a plurality of power transmission coils connected to the inverter; and
a selection switch for performing conduction and disconnection between the inverter and each power transmission coil,
the power transmission device being for performing non-contact power feeding between a power reception coil mounted to a mobile body and the power transmission coil,
the inverter and the power transmission coils being connected such that currents flow in opposite directions to each other when the selection switches of respective power transmission coils adjacent to each other, out of the plurality of power transmission coils disposed in a movement direction of the mobile body, are caused to be conductive,
the power transmission device including
a current sensor for measuring a difference in the currents flowing in the opposite directions, and
a control unit for determining whether or not the power reception coil is present above the power transmission coil, by comparing a measurement value of the current sensor with a threshold.

Effect of the Invention

According to the power transmission device disclosed in the present disclosure, it is possible to detect the position of the power reception coil without needing an additional sensor.

DESCRIPTION OF EMBODIMENTS

Hereinafter, a preferred embodiment of a power transmission device according to the present disclosure will be described with reference to the drawings. It is noted that the same components and corresponding parts are denoted by the same reference characters, and the detailed description thereof is omitted. Also in the other embodiments, components denoted by the same reference characters will not be repeatedly described.

Embodiment 1

<Basic Configuration>

Figure 1:
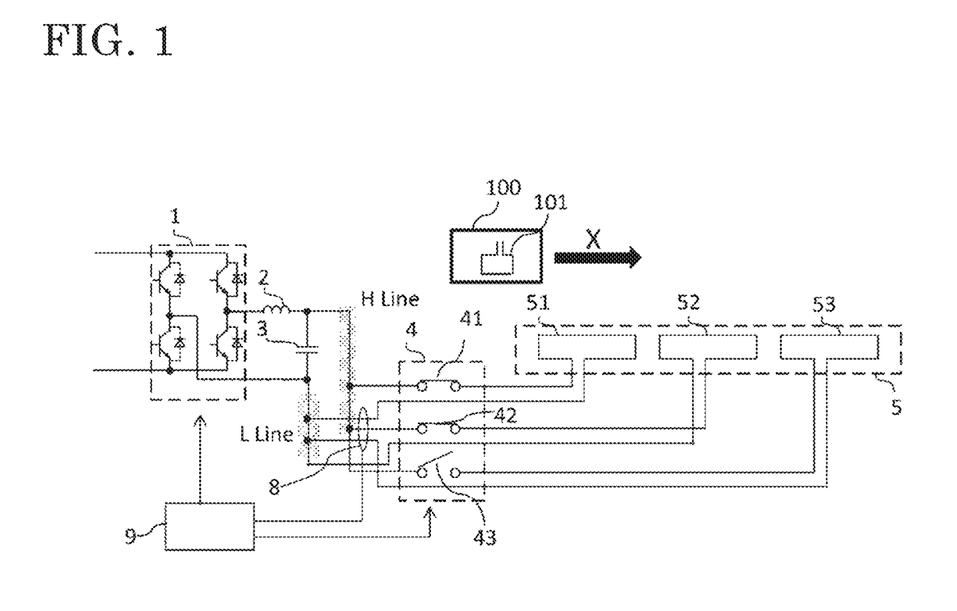
FIG. 1 is a configuration diagram of a power transmission device according to embodiment 1.

A basic configuration of a power transmission device in the present embodiment will be described. FIG. 1 is a configuration diagram showing a configuration of a power transmission device of the present embodiment. Here, a case where three power transmission coils are connected will be described. However, the present disclosure can be similarly implemented also in a case where four or more power transmission coils are connected.

The power transmission device is composed of: a high frequency inverter 1 having a bridge configuration for outputting AC power; an inductor 2 connected to an output end of the high frequency inverter 1; a capacitor 3 connected to the inductor 2; a selection switch unit 4 connected to the capacitor 3; a power transmission coil unit 5 connected to the selection switch unit 4; a current sensor 8; and a control unit 9. Arrows from the control unit 9 indicate that the control unit 9 controls the high frequency inverter 1 and the selection switch unit 4.

Figure 2:
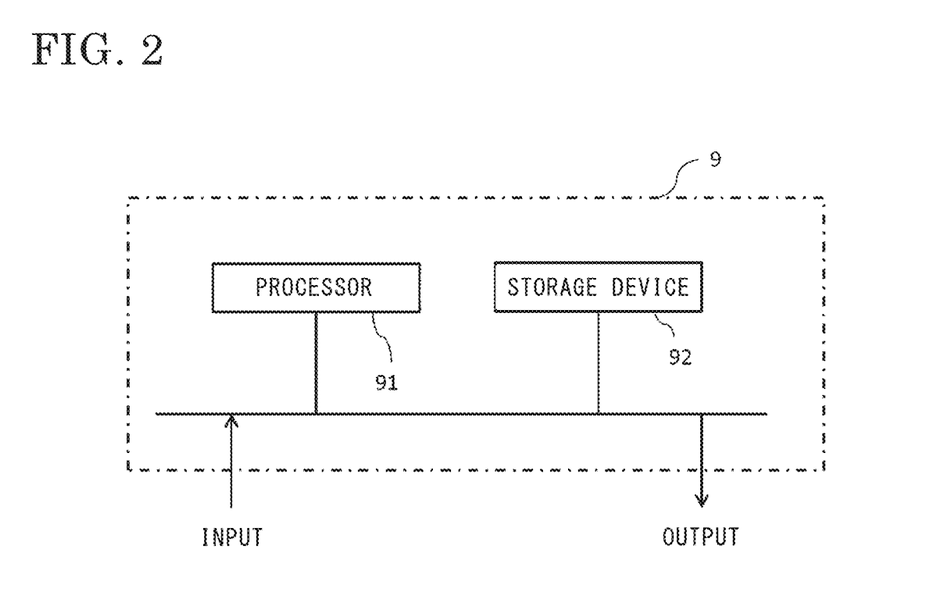
FIG. 2 illustrates a configuration of hardware of a control unit.

FIG. 2 shows an example of hardware of a microcomputer in the control unit 9. The hardware is composed of a processor 91 and a storage device 92. Although not shown, the storage device 92 includes a volatile storage device such as a random access memory, and a nonvolatile auxiliary storage device such as a flash memory. The processor 91 executes a program inputted from the storage device 92, thereby performing operation described in detail below, for example. In this case, the program is inputted to the processor 91 via the volatile storage device from the auxiliary storage device. In addition, the processor 91 may output data such as a calculation result to the volatile storage device of the storage device 92, or may save the data via the volatile storage device into the auxiliary storage device.

The hardware in the control unit 9 need not necessarily be a microcomputer, and may be an application specific integrated circuit (ASIC), a field programmable gate array (FPGA), a simple logical circuit, a relay, or the like.

In FIG. 1, the selection switch unit 4 includes a plurality of selection switches 41, 42, 43. The power transmission coil unit 5 includes a plurality of power transmission coils 51, 52, 53, and is connected in series to the respective selection switches 41, 42, 43 for the power transmission coils 51, 52, 53. The current sensor 8 can collectively measure currents flowing in the plurality of power transmission coils 51, 52, 53.

<Connection Between Power Transmission Coil and Selection Switch>

Figure 3:
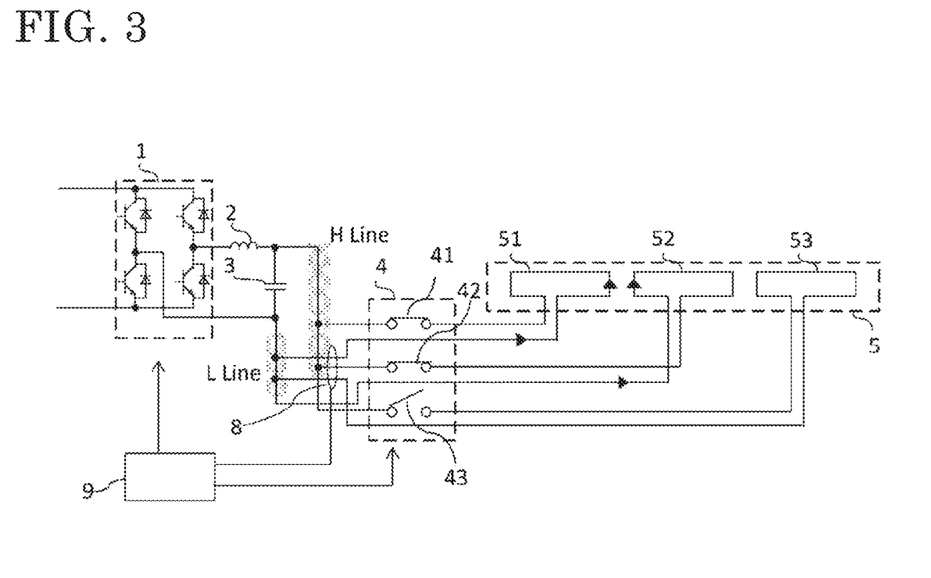
FIG. 3 illustrates current paths of currents flowing in power transmission coils of the power transmission device according to embodiment 1.

The power transmission coils 51, 52, 53 are connected to selection switches such that when the high frequency inverter 1 has outputted. AC power, current flows in the same direction in current paths where power transmission coils adjacent to each other are closest. FIG. 3 shows the orientations of currents when the currents are caused to simultaneously flow in the power transmission coil 51 and the power transmission coil 52.

<Configuration of Current Sensor>

A configuration of the part where the current sensor 8 in FIG. 1 or FIG. 3 collectively measures power transmission coil currents will be described below. When two connection ends of the capacitor 3 are defined as H Line and L Line, respectively, it is sufficient that, as the configuration of the current sensor 8, H Line and L Line are alternately present in the order of installation of the power transmission coils. For example, the current sensor 8 is configured to be able to collectively measure currents at the part connected to L Line of the power transmission coil 51, the part connected to H Line of the power transmission coil 52, and the part connected to L Line of the power transmission coil 53 (configuration in which the order of L, H, L is realized according to the installation order of the power transmission coils). Alternatively, the current sensor 8 may be configured to collectively measure currents at the part connected to H Line of the power transmission coil 51, the part connected to L Line of the power transmission coil 52, and the part, connected to H Line of the power transmission coil 53 (configuration in which the order of H, L, H is realized according to the installation order of the power transmission coils).

In FIG. 1 and FIG. 3, the high frequency inverter 1 is implemented by a full-bridge circuit using four switching elements. However, not limited to this configuration, a half-bridge circuit or another circuit configuration may be used.

For each selection switch 41, 42, 43 forming the selection switch unit 4, either of a relay switch and a semiconductor switch may be used.

<Basic Operation>

Figure 4:
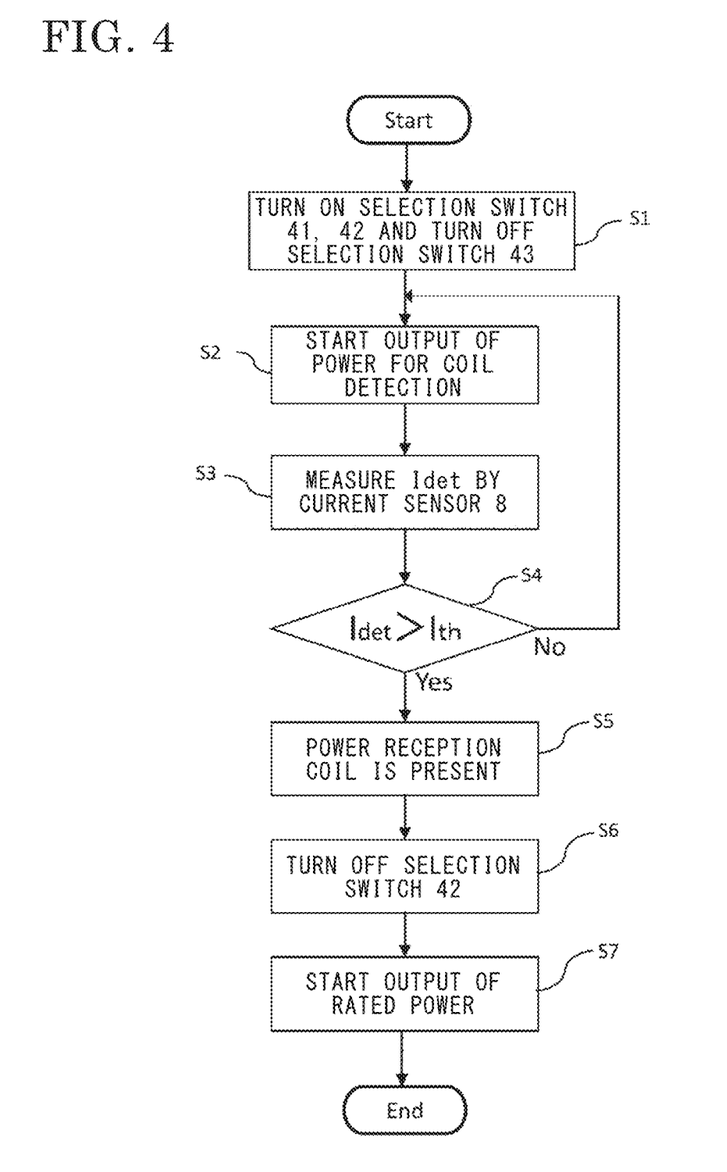
FIG. 4 is a flow chart describing operation of the power transmission device according to embodiment 1.

Next, basic operation in the present embodiment will be described with reference to a flow chart in FIG. 4.

Figure 5:
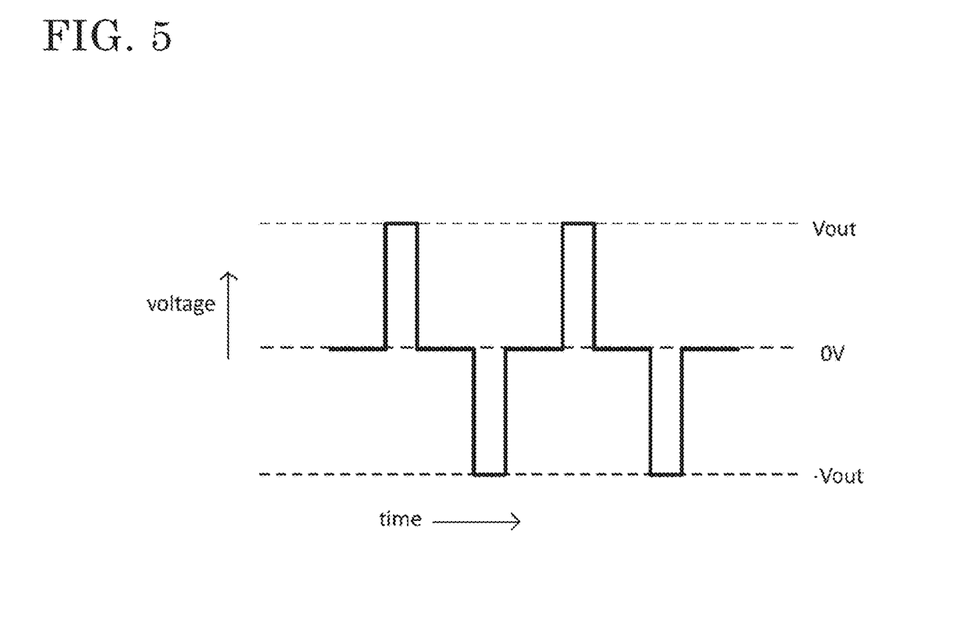
FIG. 5 is a waveform diagram showing an example of output voltage from a high frequency inverter.

First, the control unit 9 turns on the selection switches 41, 42 and turns off the selection switch 43, as shown in FIG. 1 (step S1). Among these, the two selection switches 41, 42 that are turned on are switches that have connected thereto power transmission coils (here, the power transmission coil 51 and the power transmission coil 52) adjacent to each other in an advancing direction X of a mobile body 100. With a certain time interval, the high frequency inverter 1 outputs power in order to detect a power reception coil 101 mounted to the mobile body 100. At this time, the high frequency inverter 1 outputs power (e.g., power being 1% of the rated power) smaller than that at the time of rated power input (step S2). FIG. 5 shows an example of a voltage waveform outputted from the high frequency inverter 1.

Figure 6:
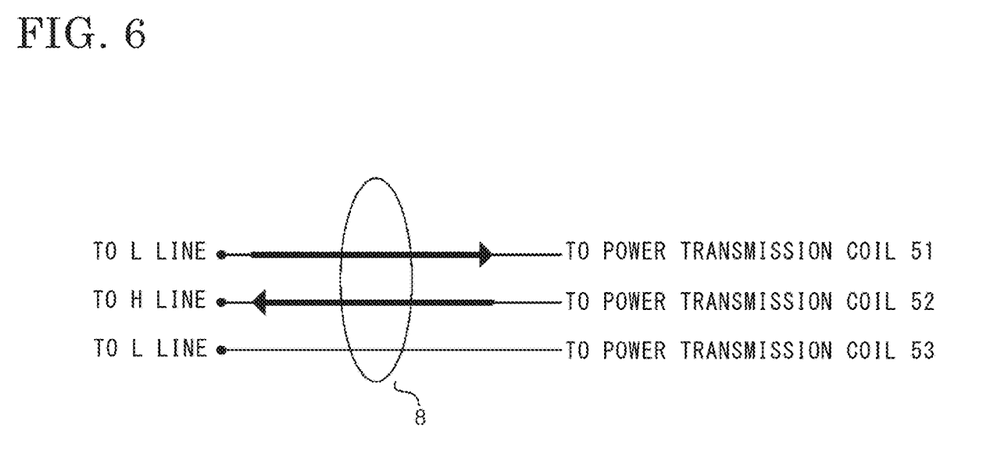
FIG. 6 illustrates an example of directions and magnitudes of currents flowing at a current sensor.

Then, a current value Idet of the current sensor S is measured (step S3). If the power reception coil 101 is not mounted to the mobile body 100, currents flow in opposite directions between the power transmission coil 51 and the power transmission coil 52 as shown in FIG. 6. Therefore, the current sensor 8 does not detect current greater than or equal to an error.

Figure 7:
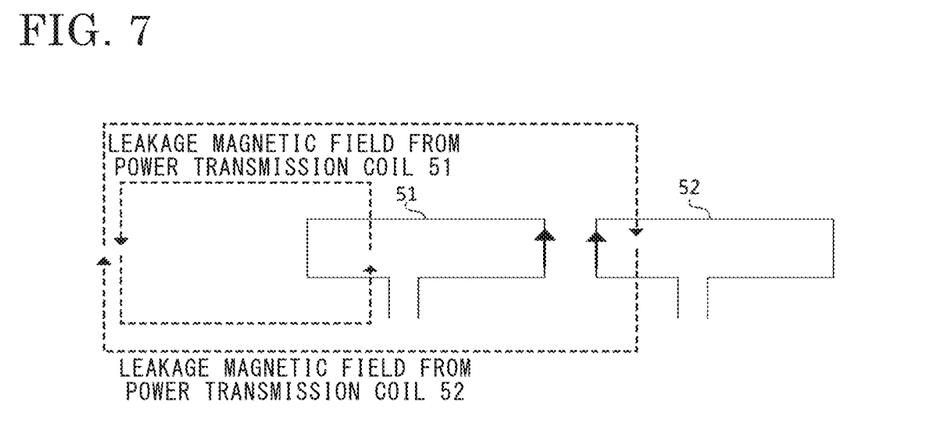
FIG. 7 illustrates an example of magnetic fields that occur in power transmission coils.

As shown in FIG. 7, magnetic fields that occur due to the currents flowing in the power transmission coil 51 and the power transmission coil 52 are in directions in which the magnetic fields cancel each other, at a part separated by a distance greater than about the diameter of the power transmission coils 51, 52, and the leakage magnetic field intensity becomes small. In FIG. 7, for simplification and clarity, the ratios of coils and magnetic fields are expressed at ratios different from actual ones.

Figure 8:
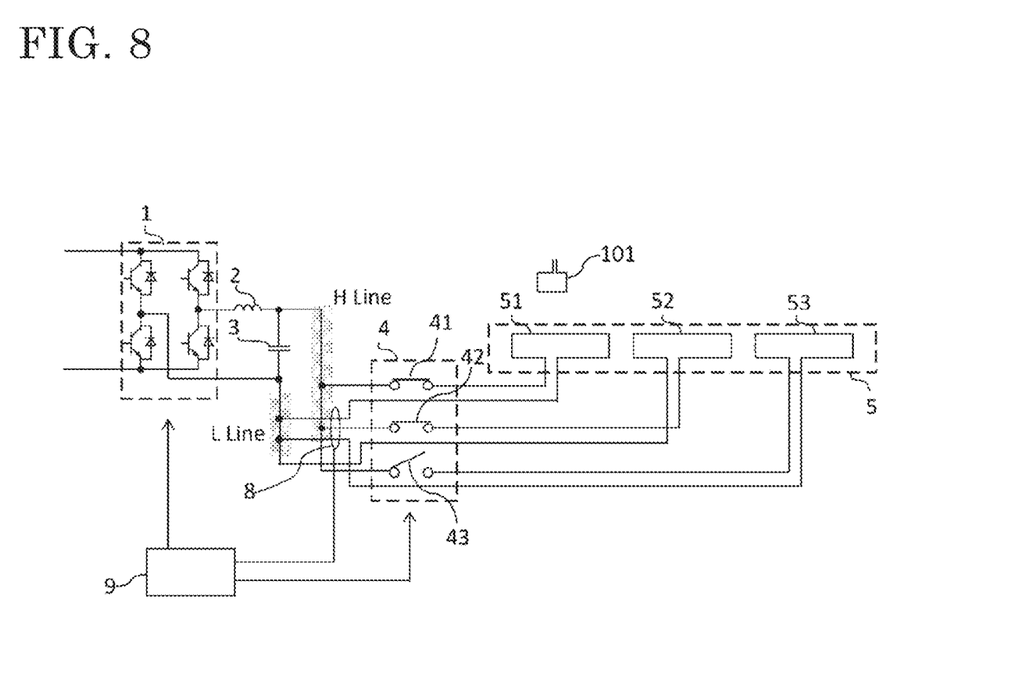
FIG. 8 is a configuration diagram of the power transmission device when a power reception coil has reached a position above a power transmission coil 51.
Figure 9:
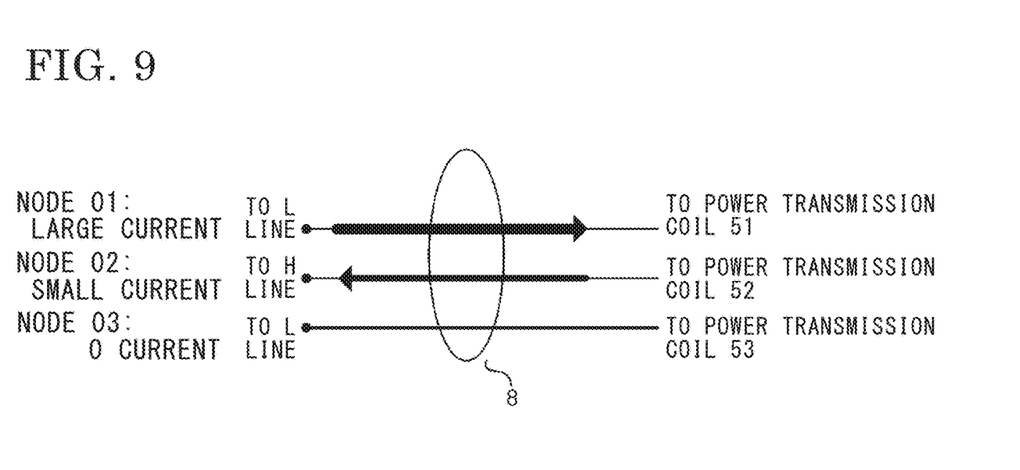
FIG. 9 illustrates another example of directions and magnitudes of currents flowing at the current sensor.

When the current detected by the current sensor 8 is sufficiently small, the control unit 9 determines that the power reception coil 101 on the mobile body 100 side is not present immediately above the power transmission coils 51, 52, 53 (step S4). Next, as shown in FIG. 8, when the power reception coil 101 mounted to the mobile body 100 has entered a range in which the power transmission coil 51 can perform power feeding (in the case of the present embodiment, immediately above the power transmission coil), a difference occurs between the impedance on the power transmission coil 51 side and the impedance on the power transmission coil 52 side. Accordingly, a difference occurs also in the currents flowing in the current sensor 8, and the currents as shown in FIG. 9 flow. A node 01, a node 02, and a node 03 are respectively defined according to the order of the current paths connected to the power transmission coils. Large current flows at the node 01, while small current flows at the node 02 when compared with that at the node 01. At the node 03, current does not flow because the selection switch is off. In such a situation, a difference occurs in the current value between the node 01 and the node 02, and thus, currents do not cancel each other. Therefore, a current value Idet is detected by the current sensor 8. When the current value Idet is sufficiently large and exceeds a threshold Ith stored in advance in the storage device 92 of the control unit 9, the control unit 9 determines that the power reception coil 101 is mounted to the mobile body 100 (step S5).

Figure 10:
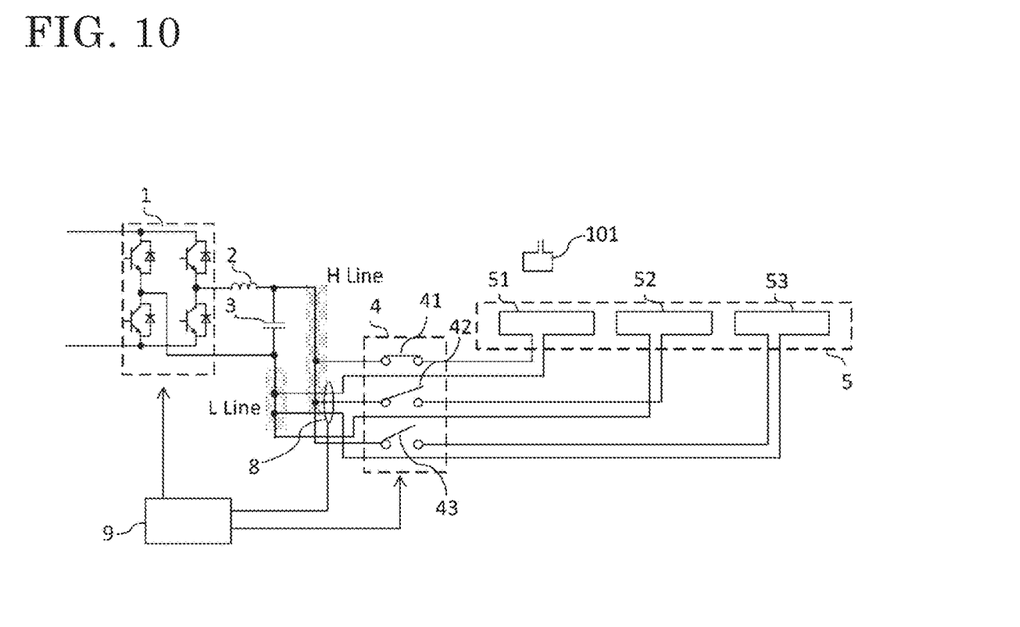
FIG. 10 is a configuration diagram of the power transmission device showing a switching state at a time when rated power is outputted to a power transmission coil.

Upon completion of the detection of the power reception coil 101, the control unit 9 turns off the selection switch 42 as shown in FIG. 10 (step S6). Since the selection switch 42 has been turned off, a state where power can be supplied only to the power transmission coil 51 magnetically coupled to the power reception coil 101 is established. Then, the high frequency inverter 1 outputs rated power in accordance with an instruction from the control unit 9 (step S7).

Figure 11:
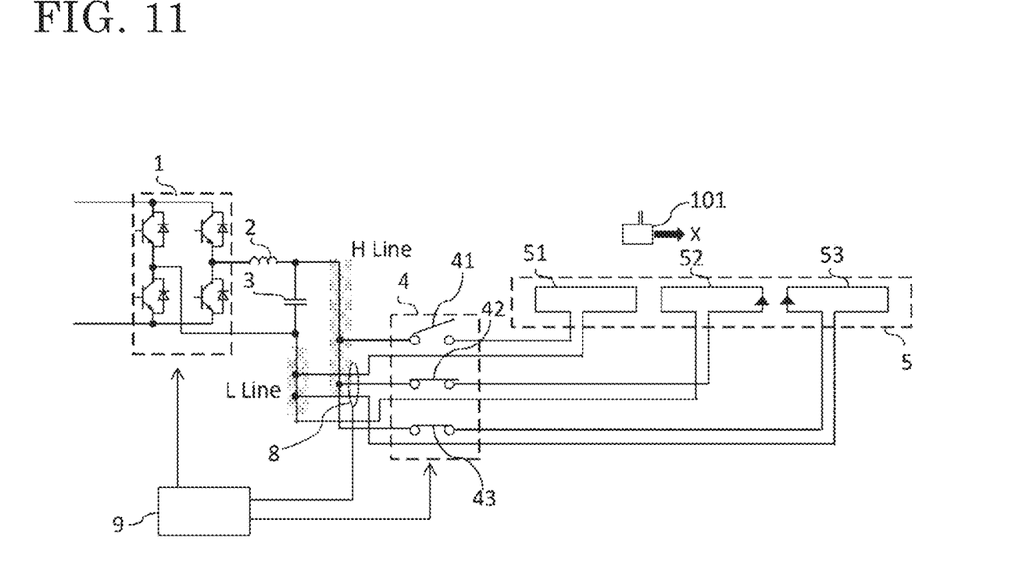
FIG. 11 is a configuration diagram of the power transmission device showing a switching state after the power reception coil has passed through the position of the power transmission coil 51.
Figure 12:
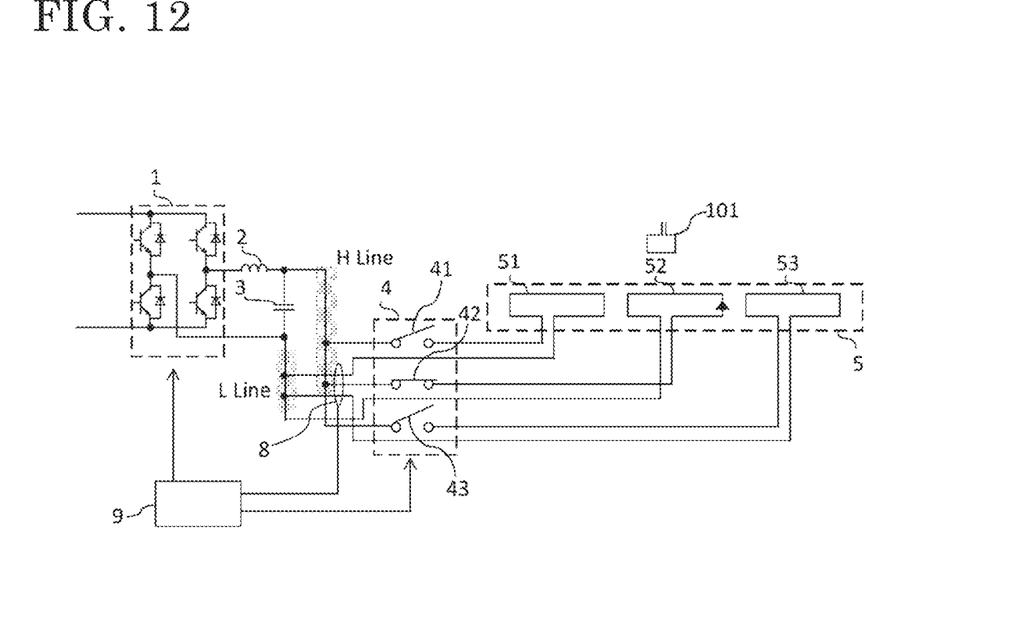
FIG. 12 is a configuration diagram of the power transmission device at a time when the power reception coil has reached a position above a power transmission coil 52.

After the power reception coil 101 has been moved out of the position immediately above the power transmission coil 51 as a result of movement of the mobile body 100, the selection switches 42, 43 are turned on and the selection switch 41 is turned off, as shown in FIG. 11, to cause currents to flow in the power transmission coil 52 and the power transmission coil 53, and detection of the power reception coil 101 of the mobile body 100 is performed in a similar manner as described above. After the power reception coil 101 has been detected, the selection switch 43 is turned off as shown in FIG. 12.

The operation in a case where three power transmission coils are connected has been described above. However, also when four or more power transmission coils are connected, the operation similar to that described above is performed while the combination of selection switches to be turned on and off is merely changed sequentially.

Effect of the Present Embodiment (1) As described above, currents are caused to simultaneously flow in the two power transmission coils 51, 52 adjacent to each other, and currents are caused to flow in orientations in which the magnetic fields cancel each other, at a part that is sufficiently separated from the power transmission coils 51, 52. With this configuration, leakage magnetic fields can be reduced. In a case where the power reception coil 101 mounted to the mobile body 100 is to be detected, when currents are intentionally caused to flow in the two power transmission coils 51, 52, leakage electromagnetic fields can be reduced.

(2) In addition, in the present embodiment, the current sensor 8 is configured to collectively measure currents flowing in the respective power transmission coils 51 to 53. When the present configuration is used, there is an effect that the number of current sensors 8 to be used in detection of the power reception coil 101 can be only one. Usually, current sensors need to be prepared by the same number as that of a plurality of power transmission coils, and the current sensors need to measure respective power transmission coil currents as necessary. However, in the configuration of the present embodiment, there is no need to provide a current sensor for each power transmission coil, and the number of current sensors can be reduced.

(3) In this configuration, for detection of the power reception coil 101, the power transmission coils 51 to 53 are provided by the same number as that of the selection switches 41 to 43; two of them can be turned on and the other of them can be turned off; and in the current paths of the power transmission coils 51, 52 adjacent to each other, conduction currents flow in opposite directions. Therefore, when the power reception coil 101 is not present in the mobile body 100, current can be caused to be always zero or very small.

Embodiment 2

<Configuration>

Figure 13:
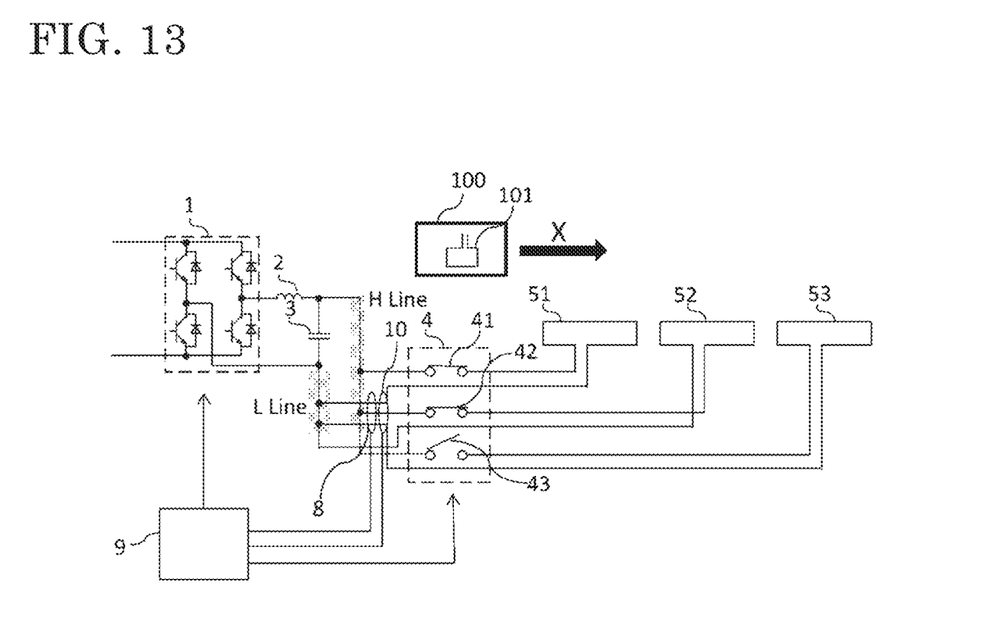
FIG. 13 is a configuration diagram of a power transmission device according to embodiment 2.

FIG. 13 illustrates a basic configuration of a power transmission device in embodiment 2. A current sensor 10 is provided at the same place as that of the current sensor 8. Here, the same place means a position at which the current sensor 10 can collectively measure the same current lines as those measured by the current sensor 8. This current sensor 10 has a resolution setting different from that of the current sensor 8, and the current sensor 10 can measure larger current than the current sensor 8. The current sensor 10 is not used at the time of detection of the power reception coil 101, and is used in transmission of rated power after the detection of the power reception coil 101.

<Basic Operation>

The basic operation in embodiment 2 is similar to that described in embodiment 1. The current sensor 8 detects current, and after it has been determined that the power reception coil 101 is present above the power transmission coils 51 to 53, rated output of high frequency power is performed from the high frequency inverter 1. At this time, the current sensor 10 is used for control of output power or output current from the high frequency inverter 1.

Effect of Embodiment 2

It is difficult for a current sensor to measure both large current and small current, due to the relationship with the resolution thereof. Therefore, as in embodiment 1, when the current sensor 8 is used for both the detection operation of the power reception coil 101 and the power control at the time of rated output operation, the measurable minimum current value becomes larger than that of a current sensor for small current. As a result, at the time of detection of the power reception coil 101, large power has to be supplied to the power transmission coil from the high frequency inverter 1 when compared to that in the case of a current sensor for small current. This increases the intensity of unnecessary leakage electromagnetic fields. For example, when it is assumed that the resolution of the current sensor 8 is 8 bits and the maximum value of the current value at the time of power transmission is 100 amperes, the minimum current value that can be measured by the current sensor 8 is about 0.4 amperes. Therefore, when an operation of detecting the power reception coil 101 is performed, the power reception coil 101 cannot be detected unless current of not less than 0.4 amperes is caused to flow.

Therefore, when the current sensor 10 is used for power control at the time of rated output, the current sensor 8 to be used in detection of the power reception coil 101 can be configured to be able to measure small current when compared with the current sensor 10. This configuration has an effect that supply power from the high frequency inverter 1 when detecting the power reception coil 101 can be made small, and thus, the leakage electromagnetic fields can be reduced.

Embodiment 3

<Configuration>

Figure 14:
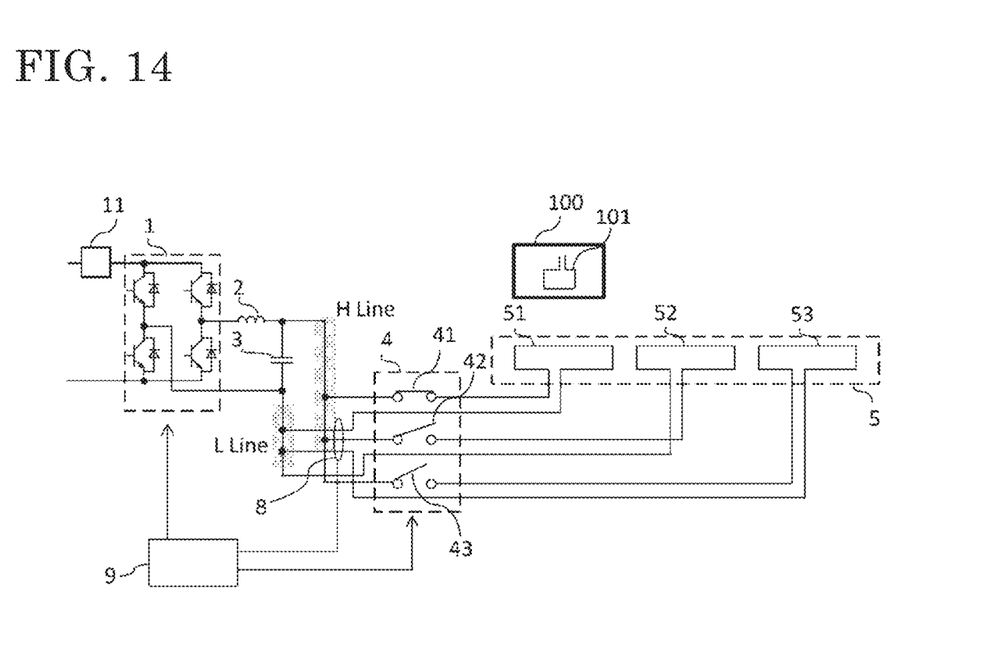
FIG. 14 is a configuration diagram of a power transmission device according to embodiment 3.

FIG. 14 shows a power transmission device of embodiment 3. A current sensor 11 is provided separately from the current sensor 8. The current sensor 11 is provided at a place where the current sensor 11 can measure input current of the high frequency inverter 1. This current sensor 11 is not used at the time of detection of the power reception coil 101 of the bile body 100, and is used for power control at the time of rated power transmission after the detection of the power reception coil 101.

<Basic Operation>

The basic operation in the present embodiment is similar to that described in embodiment 1. The current sensor 8 detects current, and after it has been determined that the power reception coil 101 of the mobile body 100 is present above the power transmission coils 51 to 53, rated output of high frequency power is performed from the high frequency inverter 1. At this time, the current sensor 11 is used for control of output power or output current from the high frequency inverter 1.

Effect of Embodiment 3

(1) As described in embodiment 2, when detection of the power reception coil 101 and control of transmission power are performed by only the current sensor 8, a problem due to the resolution of the current sensor occurs. In contrast to this, since the current sensor 11 for power control is provided separately from the current sensor 8 for detection of the power reception coil 101, when the power reception coil 101 mounted to the mobile body 100 is to be detected, output power from the high frequency inverter 1 can be made low, and thus, leakage magnetic fields can be reduced.

(2) In addition, since the current sensor 11 is provided at a current input portion of the high frequency inverter 1, there is an effect that effective power at transmission of rated output can be highly accurately controlled. In embodiment 2, since output current of the high frequency inverter 1 is measured, an error between a target value and an actual value of transmission power may become large depending on the power factor of the output portion of the high frequency inverter 1. Although the effective value of transmission power can be controlled in consideration of the power factor, calculation becomes complicated because calculation of a phase difference between output voltage and output current of the high frequency inverter 1 is performed, for example. In contrast to this, in the present embodiment, since input current of the high frequency inverter 1 is measured, effective power can be substantially measured. Therefore, the aforementioned correction based on the power factor is not necessary. This configuration is effective when highly accurate transmission power control is required with respect to the mobile body 100. That is, when the configuration of the present embodiment is used, highly accurate power control is facilitated even in the case of a low power factor.

Embodiment 4

<Configuration and Operation>

The basic configuration of a power transmission device in the present embodiment is the same as that in embodiment 1. The present embodiment is characterized in that, in embodiment 1, a measurement value measured by the current sensor 8 in advance is used as the threshold Ith stored in the storage device 92 in advance.

Figure 15:
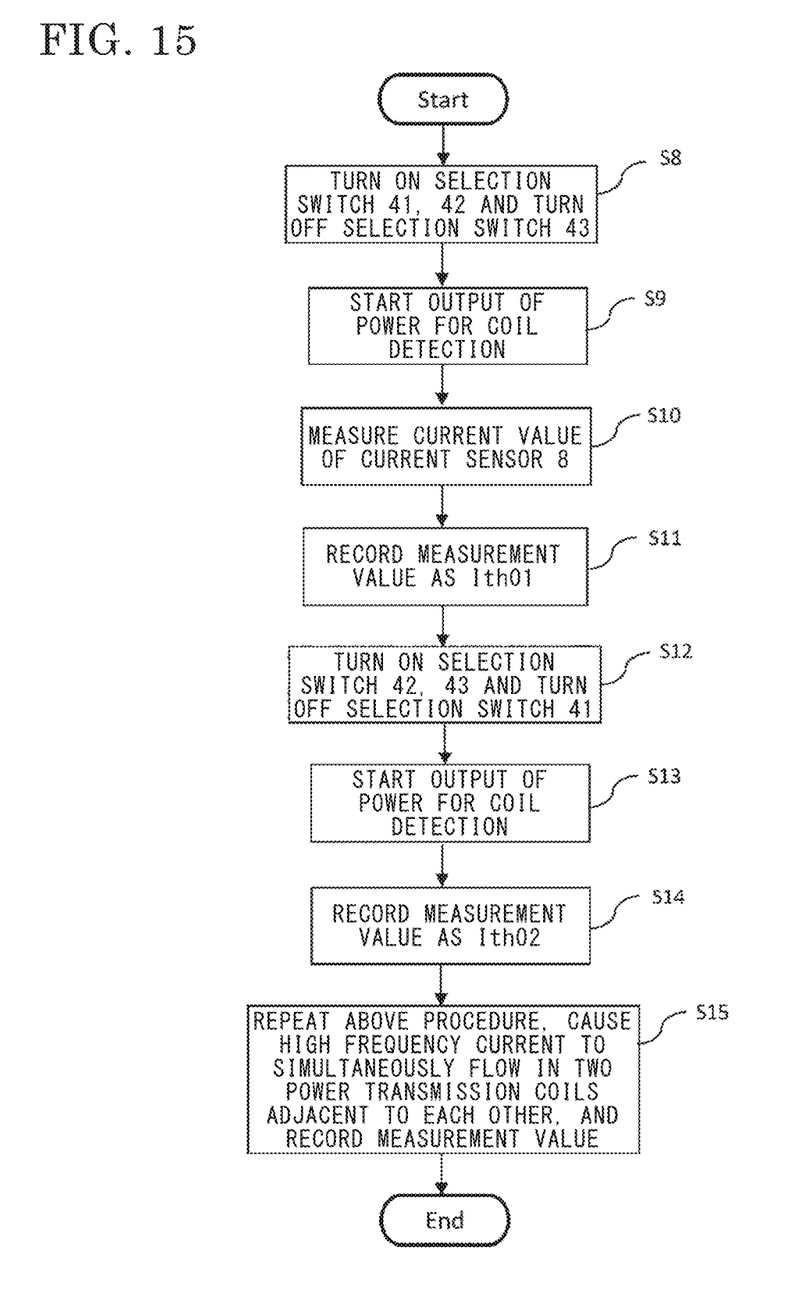
FIG. 15 is a flow chart showing an example of operation of a power transmission device according to embodiment 4.

That is, before the basic operation described in embodiment 1, the following operation described in FIG. 15 is performed.

In a situation where it is clear that the power reception coil 101 is not present, the selection switches 41, 42 are turned on and the selection switch 43 is turned off (step S8). Then, the high frequency inverter 1 outputs high frequency power to be used at the time of detection of the power reception coil (step S9). Output of the current sensor 8 is measured (step S10), and a current value Ith01 having been measured is recorded into the storage device 92 (step S11). Next, the selection switches 42, 43 are turned on, and the selection switch 41 is turned off (step S12). Then, the high frequency inverter 1 outputs high frequency power to be used at the time of detection of the power reception coil (step S13). Output of the current sensor 8 is measured (step S7), and a current value (Ith02) having been measured is recorded into the storage device 92 (step S14).

In a case where four or more power transmission coils are present, the above-described procedure is repeated, high frequency current is sequentially caused to simultaneously flow in two power transmission coils adjacent to each other, and a current value (Ithx) measured by the current sensor 8 is recorded (step 315). x in Ithx denotes the number of power transmission coils counted from 01.

Figure 16:
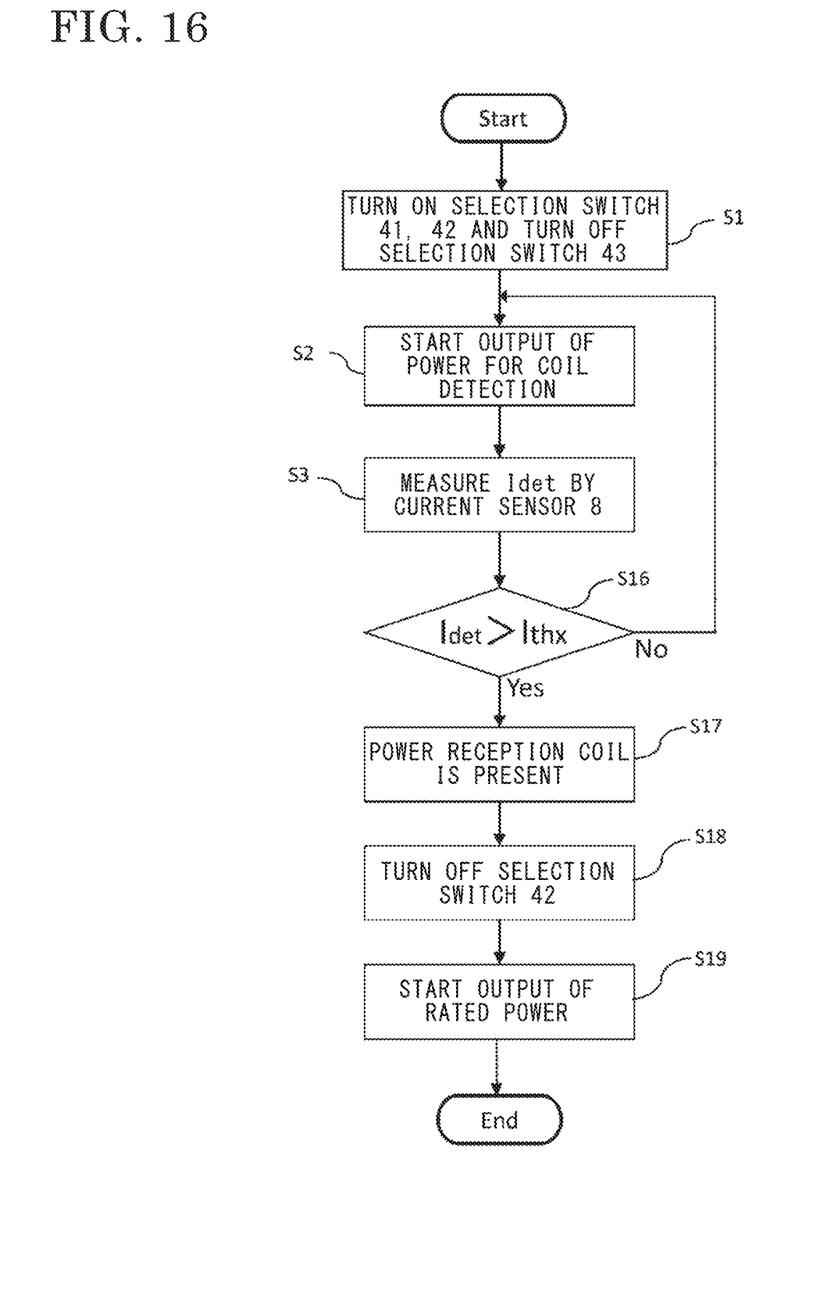
FIG. 16 is another flow chart showing an example of operation of the power transmission device according to embodiment 4.

Next, as shown in FIG. 16, the operation according to embodiment 1 is performed. The selection switches 41, 42 are turned on, and the selection switch 43 is turned off (step S1). Among these, the two selection switches 41, 42 that are turned on are switches that have connected thereto the power transmission coils 51, 52 adjacent to each other in the advancing direction X of the mobile body 100. With a certain time interval, the high frequency inverter 1 outputs power to the power transmission coils 51, 52 in order to detect the power reception coil 101 (step S2).

The current value Idet measured by the current sensor 8 (step 33) and the current value Ith01 recorded in the storage device 92 are compared with each other (step S16). When the current value Idet is equivalent to or not greater than the current value Ith01, it is determined that the power reception coil 101 is not present above the power transmission coil 51, and detection of the power reception coil is continued. When the current value Idet measured by the current sensor 8 is greater than the current value Ith01, it is determined that the power reception coil 101 is present above the power transmission coil 51 (step S17), the selection switch 42 is turned off (step S18), and rated output is started from the power transmission coil 51 connected to the selection switch 41 being on, to the power reception coil 101 (step S19). After the power reception coil 101 has been moved out of the position immediately above the power transmission coil 51, the selection switches 42, 43 are turned on and the selection switch 41 is turned off. Then, the recorded current value Ith02 is compared with the current value Idet for the next power transmission coils 52, 53. Operation similar to that described above is repeated by the number x of power transmission coils.

Effect of Embodiment 4

The plurality of power transmission coils 51 to 53 can have different inductance values due to an error at the time of production, difference in installation place, difference in distance between the high frequency inverter and the installation places of the power transmission coils, or the like. In this case, even when high frequency current is caused to flow to the two power transmission coils 51, 52 adjacent to each other in a state where the power reception coil 101 is not present immediately above the power transmission coils, current detected by the current sensor 8 may not necessarily become 0, and a current value may be detected by the difference in inductance. In order to eliminate this current value, it is conceivable to perform parameter adjustment and screening at the time of production of the power transmission coils. However, such a measure requires labor and cost is increased. If the method of the present embodiment is used, even when there is a difference in inductance of the respective power transmission coils 51 to 53 or an error in inductance due to installation thereof, accuracy of determination as to the presence or absence of the power reception coil 101 can be improved because the current values Ithx (in the case of the present embodiment, x=01 to 03) measured when the power reception coil 101 is absent are all recorded.

Accordingly, tolerance to errors at the time of production of power transmission coils or tolerance to change in the inductance value at the time of installation thereof can also be improved.

Although the present disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

1 high frequency inverter
2 inductor
3 capacitor
4 selection switch unit
5 power transmission coil unit
8, 10, 11 current sensor
9 control unit
100 mobile body
101 power reception coil

The invention claimed is:

1. A power transmission device comprising:
an inverter for outputting AC power;
a plurality of power transmission coils connected to the inverter; and
a selection switch for performing conduction and disconnection between the inverter and each power transmission coil,
the power transmission device being for performing non-contact power feeding between a power reception coil mounted to a mobile body and the power transmission coil,
the inverter and the power transmission coils being connected such that currents flow in opposite directions to each other when the selection switches of respective power transmission coils adjacent to each other, out of the plurality of power transmission coils disposed in a movement direction of the mobile body, are caused to be conductive,
the power transmission device comprising
a current sensor for measuring a difference in the currents flowing in the opposite directions, and
a controller to determine whether or not the power reception coil is present in a range that allows power feeding from the power transmission coil, by comparing a measurement value of the current sensor with a threshold.

2. The power transmission device according to claim 1, wherein
when the controller has determined that the power reception coil is present in the range that allows power feeding from the power transmission coil, control is performed such that: connection between the inverter and a power transmission coil, out of the power transmission coils adjacent to each other, that is on a side where the power reception coil is not present is disconnected; and in order to perform power feeding to the power reception coil, power is supplied from the inverter to a power transmission coil that is being conductive to the inverter.

3. The power transmission device according to claim 2, wherein
the current sensor also detects current for supplying power to the power transmission coil that is being conductive to the inverter.

4. The power transmission device according to claim 2, wherein
another current sensor which detects current for supplying power to the power transmission coil that is being conductive to the inverter, and which has a resolution different from that of the current sensor is disposed at a same place as that of the current sensor, the same place allowing measurement of a difference in the currents flowing in the opposite directions.

5. The power transmission device according to claim 2, comprising
a current sensor for measuring input current of the inverter in order to control current at a time when power is supplied to the power transmission coil that is being conductive to the inverter.

6. The power transmission device according to claim 1, wherein
 the threshold is a value obtained by measuring in advance a difference in currents, at a time when the power reception coil is not present, flowing in the opposite directions in the power transmission coils adjacent to each other.

\* \* \* \* \*